United States Patent
Gamand et al.

(10) Patent No.: US 7,030,455 B2
(45) Date of Patent: Apr. 18, 2006

(54) INTEGRATED ELECTROMAGNETIC SHIELDING DEVICE

(75) Inventors: Patrice Gamand, Douvres la Delivrande (FR); Alain De La Torre, Caen (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/946,715

(22) Filed: Sep. 5, 2001

(65) Prior Publication Data

US 2002/0074605 A1 Jun. 20, 2002

(30) Foreign Application Priority Data

Sep. 5, 2000 (FR) .................................. 00 11307

(51) Int. Cl.
*H01L 29/00* (2006.01)
*H01L 23/552* (2006.01)
*H01L 39/00* (2006.01)
*H01L 23/34* (2006.01)

(52) U.S. Cl. ..................... 257/508; 257/509; 257/510; 257/659; 257/660; 257/662; 257/725

(58) Field of Classification Search ................ 257/508, 257/510, 347, 340, 409, 511, 660, 662, 659, 257/725
See application file for complete search history.

(56) References Cited

U.S. PATENT DOCUMENTS

| 4,608,590 | A | * | 8/1986 | Hartman et al. ............ 257/124 |
| 4,954,929 | A | | 9/1990 | Baran ......................... 361/414 |
| 4,956,688 | A | * | 9/1990 | Honma et al. ............... 257/477 |
| 5,151,770 | A | | 9/1992 | Inoue ........................... 357/53 |
| 5,196,920 | A | * | 3/1993 | Kumamoto et al. ......... 257/798 |
| 5,345,105 | A | * | 9/1994 | Sun et al. .................... 257/659 |
| 5,585,664 | A | * | 12/1996 | Ito ............................... 257/659 |
| 5,631,491 | A | * | 5/1997 | Matsuzaki ................... 257/487 |
| 5,831,324 | A | | 11/1998 | Bang .......................... 257/508 |
| 5,859,466 | A | * | 1/1999 | Wada .......................... 257/508 |
| 5,994,765 | A | * | 11/1999 | Mitra et al. ................. 257/659 |
| 6,075,700 | A | | 6/2000 | Houghton et al. .......... 361/704 |
| 6,157,065 | A | * | 12/2000 | Huang et al. ............... 257/173 |
| 6,472,723 | B1 | * | 10/2002 | Jarstad et al. ............... 257/659 |

OTHER PUBLICATIONS

"Signal Isolation in BiCMOS Mixed Mode Integrated Circuits", by K. Joardar, IEEE, 1995, pp. 178-180.

* cited by examiner

*Primary Examiner*—Steven Loke
*Assistant Examiner*—Samuel A Gebremariam

(57) ABSTRACT

To isolate at least one electric or electronic element (16, 58), for example an interconnection integrated onto a semiconductor substrate (12), this device comprises at least one isolation means chosen from an isolating layer (84, 86, 90) extending in the substrate and an assembly whose height exceeds that of the element and which comprises, on either side of the element, at least two superposed conductors (60 62 64, 66 68 70), which are integrated into the substrate and extend along the element.

5 Claims, 4 Drawing Sheets

INTEGRATED ELECTROMAGNETIC SHIELDING DEVICE

FIELD OF THE INVENTION

The invention relates to an integrated electromagnetic shielding device and, more particularly, to a device for isolating an electric or electronic element integrated onto a semiconductor substrate.

The invention is used, in particular, to isolate electrical signals which propagate in connections formed on semiconductor substrates, or which are generated in integrated circuits or elements of such circuits.

PRIOR ART

Electronic devices are known, for example integrated emitter-receiver circuits, wherein various types of signals coexist. These signals may differ from each other in that their frequencies are different or by the kind of information they convey: some signals may be logic signals while other signals are analog signals.

The coexistence of these different signals adversely affects the functioning of the circuits. By way of example, a digital signal, such as a clock signal, is likely to interfere with an analog signal.

In addition, the integration of inductive elements into these circuits causes electromagnetic coupling between these inductive elements and electric connections, resulting in the propagation of other signals.

Thus, in an integrated receiver, there is a risk that the spectral quality of the frequencies generated by voltage-controlled oscillators is disturbed by the switching operations of clock signals.

In an electronic device, it is thus necessary to effectively isolate the electric connections wherein signals propagate that are likely to disturb the functioning of the device.

In accordance with a known method, this problem is partly overcome in that an interfering connection is inserted between two conductor lines, which conductor lines are subsequently connected to ground or to a DC voltage source.

This solution is diagrammatically shown in cross-section in FIG. 1, which shows a silicon substrate 2 which is covered with a thin film of silicon dioxide on which the interfering connection 6 is provided as well as the two conductor lines 8 and 10.

The article "Signal isolation in BiCMOS mixed mode integrated circuits" by K. Joardar, 1995, IEEE, p. 178, also deals with this topic.

The known solution only provides partial shielding: it does not preclude electromagnetic coupling between the interfering connection 6 and other connections or components, not shown, which are also formed on the substrate 2.

In addition, this known solution does not enable the interfering connection 6 to be properly isolated, in the millimetric and hyperfrequency ranges, with respect to said other connections or components: signals of said frequencies are likely to be exchanged between said other connections or components and the interfering connection 6 through the agency of the substrate 2.

BRIEF DESCRIPTION OF THE INVENTION

It is an object of the invention to overcome said drawbacks.

The invention aims at providing a device for isolating at least one electric or electronic element integrated onto a semiconductor substrate, which isolation device is characterized in that it comprises at least one isolation means selected from:

an isolating layer which extends in the substrate, and
an assembly whose height exceeds that of the element, and which includes, on either side of the element, at least two superposed electric conductors, which are integrated into the substrate and extend along the element.

This electric or electronic element may be an electric connection as well as an electric or electronic component or an integrated circuit or a part of such a circuit, or even a region integrated into the substrate and bounded by the device, with signals in the millimetric, radio frequency or hyperfrequency ranges being capable of propagation in said region, so that the device also forms an integrated propagation medium (which is self-shielding as it were).

In accordance with a particular embodiment of the device in accordance with the invention, the isolating layer is a semiconductor layer which is buried in the substrate, said layer extending below the element and being provided with a doping type that is in opposition to that of the substrate, so as to form a PN junction with said substrate, the device further comprising means of reverse biasing of the PN junction.

In accordance with a further particular embodiment, the device additionally comprises at least one trench, which extends in the substrate, at right angles to the surface of the substrate and along the element, and between this element and another electric or electronic element, the isolating layer filling said trench in order to isolate the elements from each other.

The device in accordance with the invention may comprise two isolating layers, which fill two trenches extending in the substrate, perpendicularly to the surface of the substrate and along the element, on either side of this element.

Each trench may extend below the two superposed conductors.

In accordance with yet another particular embodiment, the device additionally comprises various parallel trenches extending in the substrate, perpendicularly to the surface of the substrate, below the element and transversely to said element, each trench being filled with an isolating layer.

In accordance with a preferred embodiment of the device in accordance with the invention, the superposed electric conductors are electrically interconnected by means of at least one via formed through an electrically insulating material.

In this case, each via may extend from one end to the other end of the superposed conductors or the superposed electric conductors may be interconnected by means of a number of spaced apart vias.

In accordance with yet another particular embodiment, the device in accordance with the invention additionally comprises an electrically conducting layer which extends above the element and connects the two uppermost electric conductors to each other, said conductors being arranged on either side of the element.

In accordance with a further particular embodiment, the device in accordance with the invention comprises an additional isolating layer which extends in the substrate, below the element, and isolates a portion of the substrate, where the element is formed, from the rest of the substrate.

In accordance with yet another particular embodiment, the isolating layer extends in the substrate, below the element, and isolates a portion of the substrate, where the element is formed, from the rest of the substrate, and the isolating means additionally comprises two electric conductors, integrated into the substrate, which are arranged above said portion of the substrate where the element is formed, respectively, on either side of this element, and extend along this element.

BRIEF DESCRIPTION OF THE DRAWINGS

These and other aspects of the invention will be apparent from and elucidated with reference to the embodiments described hereinafter, which serve only as information and are not to be interpreted in a limiting sense, the embodiments being described with reference to the annexed drawings, wherein.

DETAILED DESCRIPTION OF PARTICULAR EMBODIMENTS

Figure 1:
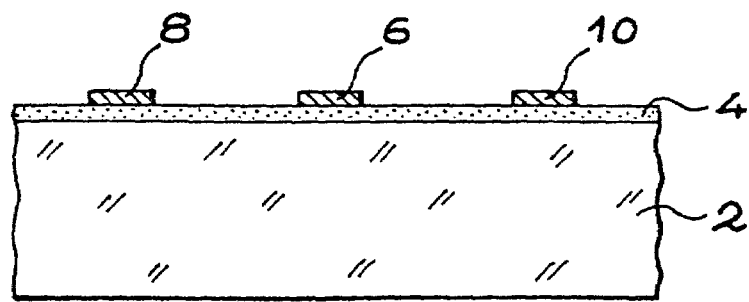
FIG. 1 is a diagrammatic, cross-sectional view of a known device intended to isolate an interfering connection, which device has already been described.
Figure 2:
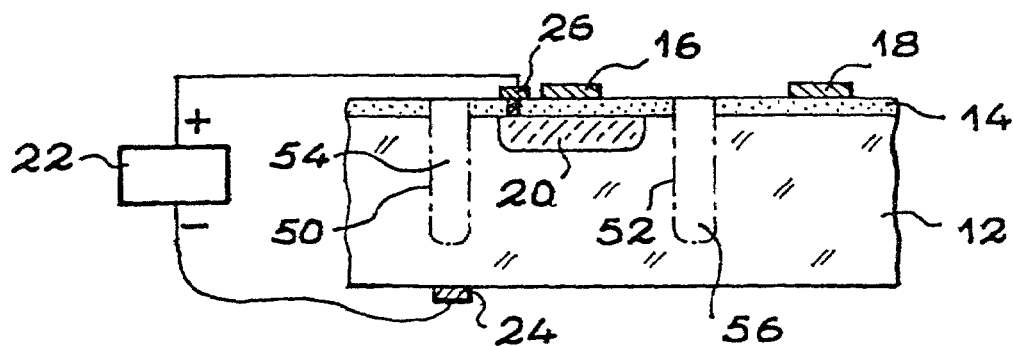
FIG. 2 is a diagrammatic, cross-sectional view of a particular embodiment of the device in accordance with the invention.

FIG. 2 diagrammatically shows an example in accordance with the invention, comprising, for example a P-type, silicon semiconductor substrate 12. This substrate is covered with an electrically insulating thin film 14, which is made of, for example, silicon dioxide in a thickness below, for example, 10 μm. The element to be isolated is a conductor line 16 which is formed on the insulating layer 14.

It is desired, for example, to isolate the conductor line 16 from another conductor line 18, which extends parallel to line 16 and is also formed on the insulating layer 14.

For this purpose, use is made of an isolating layer which, in the example shown in FIG. 2, is an N-type buried semiconductor layer 20 obtained by diffusion into the substrate prior to forming the film 14. This layer 20 extends below the conductor line 16 and is wider than said line 16, as is shown in FIG. 2.

A DC voltage source 22 is provided to reverse bias the PN junction formed by the layer 20 and the substrate: the −pole of the source 22 is connected to the substrate 12 by means of an electrical contact 24, and the +pole of this source 22 is connected to the buried layer 20 by means of a via 26 through the isolating layer 14.

In this manner, a capacitive isolation of the conductor line 16 is obtained.

If the substrate 12 is made of an N-type semiconductor material, then a P-type buried layer 20 is formed, and use is made of a DC voltage source whose −pole is connected to said P-type buried layer and the +pole is connected to the substrate.

Figure 3:
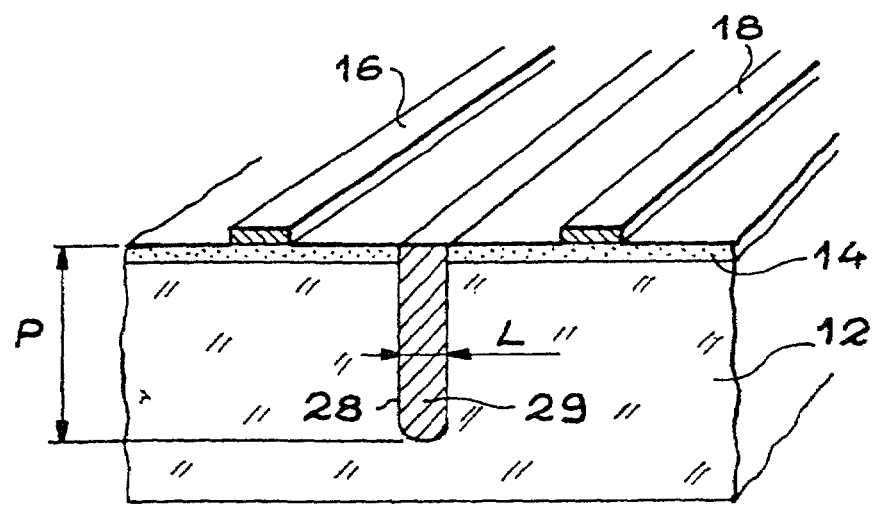
FIG. 3 is a diagrammatic view of a part of a different, particular embodiment of the device in accordance with the invention.

Another example in accordance with the invention is diagrammatically shown in FIG. 3, which also depicts the semiconductor substrate 12 and the insulating thin film 14 formed at the surface thereof. FIG. 3 also shows the conductor lines 16 and 18 which are to be isolated from each other in accordance with the invention.

To achieve this, a deep trench 28 is formed which extends parallel to the lines 16 and 18 and is situated between said lines. This trench is formed across the thickness of the insulating layer 14 and extends in the substrate 12, the depth P of this trench being equal to, for example, 6 μm and the width L being equal to, for example, 2 μm.

After the trench 28 has been formed, it is filled with an isolating layer 29, which may be made from an electrically insulating material or from a conducting or semiconducting material.

Another example in accordance with the invention is diagrammatically shown in FIG. 4, which again comprises the conductor line 16. The other conductor line 18 and possible other elements to be isolated from the conductor line 16 are not shown in this drawing.

Figure 4:
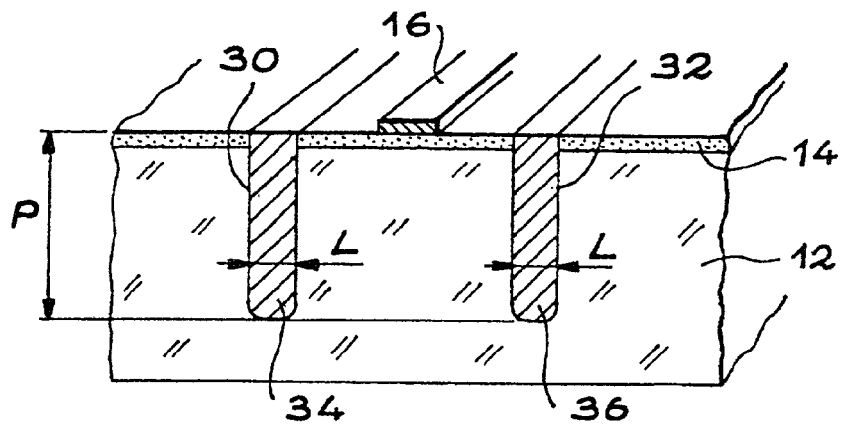
FIG. 4 is a diagrammatic view of a part of a modification of the device shown in FIG. 3.

FIG. 4 shows two deep trenches 30 and 32 extending parallel to each other and to the conductor line 16, which trenches extend, respectively, on either side of the conductor line. These two trenches are again formed across the thickness of the insulating layer 14 and extend in the substrate 12.

The depth P and the width L of these trenches may be, for example, the same as mentioned hereinabove.

After these trenches have been formed they are filled with, respectively, isolating layers 34 and 36, which may be made of an electrically insulating material or of a conducting or semiconducting material.

Another example in accordance with the invention is diagrammatically shown in FIG. 5, which again comprises the conductor line 16 formed on the insulating thin film 14 covering the substrate 12 (not shown in FIG. 5).

Several parallel, deep trenches 38 extend in the substrate, perpendicularly to the surface thereof, and are formed across the thickness of the layer 14 and below the conductor line 16. In addition, as shown in the drawing, these trenches extend perpendicularly to said line 16.

Each trench 38 is filled with an isolating layer 40. Besides, each trench has a width L of, for example, 20 μm, which is larger than the width of the conducting track 16; the space E between two adjacent trenches 38 is, for example, 2 μm; the depth of the trenches 38 is, for example, 6 μm, and the length or thickness e of the trenches 38 is, for example, 2 μm.

First, the trenches 38 are formed in the substrate 12, across the thickness of the insulating layer 14, and each trench is filled with an isolating layer 40, after which the conductor line 16 is formed.

The trenches 38, which are each filled with an isolating layer 40, enable the formation of longitudinal currents in the substrate 12 to be precluded.

In another example in accordance with the invention (also see FIG. 5), apart from the transverse trenches 38, two longitudinal trenches 42 and 44 are provided which are filled with isolating layers 46 and 48 and are arranged, respectively, on either side of the arrangement of trenches 38. These trenches 42 and 44 are of the same type as the trenches 34 and 36 shown in FIG. 4. They extend along the conductor line 16 and enable the isolation of said conductor line to be enhanced. To achieve this purpose, it would also be possible to form deep longitudinal trenches in the substrate so as to electrically interconnect the transverse trenches 38 and thus form an equipotential grid below the conductor line 16.

In another example of the invention (see FIG. 2), two longitudinal trenches 50 and 52 are provided which extend parallel to the conducting track 16 and on either side of the buried layer 26. These trenches 50 and 52, which are filled with isolating layers 54 and 56, also enable the isolation of the conductor line 16 shown in FIG. 2 to be increased.

The isolating layers which fill the trenches (irrespective of whether these trenches extend along the element to be isolated or transversely to said element) can be made of a polysilicon having a low resistivity or of an electrically insulating material such as silicon dioxide.

If the trenches extend along the element to be isolated without contacting said element, use can be made of an electrically conducting material, for example polysilicon having a low resistivity, to form the isolating layers used to fill the trenches.

Figure 6:
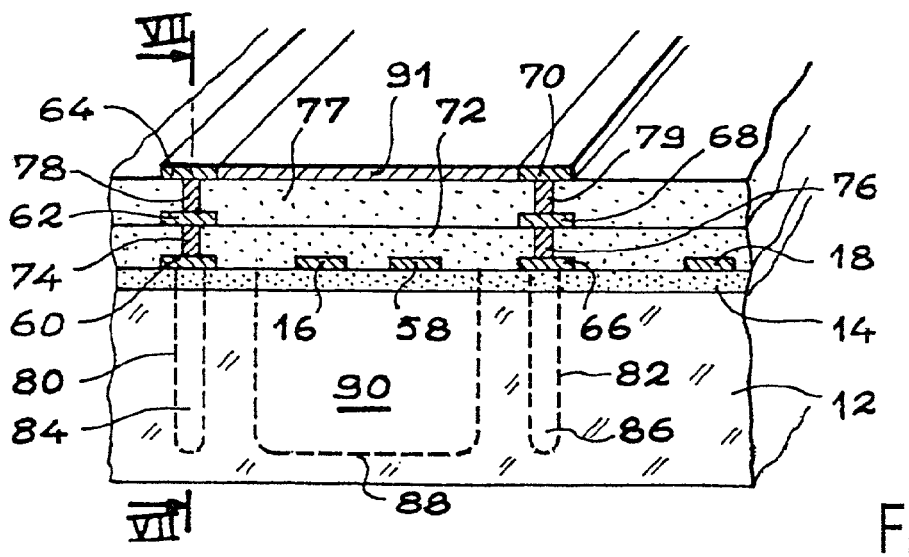
FIG. 6 is a diagrammatic view of a part of another particular embodiment of the device in accordance with the invention.

In the example of the invention that is diagrammatically shown in FIG. 6, an element such as the conductor line 16 formed on the insulating layer 14 covering the substrate 12, can be isolated using a group of at least two (three in the example shown in FIG. 6) superposed electric conductors on either side of the conductor line 16. These electric conductors are integrated in the substrate 12 and extend along the conductor line 16.

The height of each group exceeds that of the line 16.

It is to be noted that, in accordance with the invention, it is possible to isolate not only a single element, but a plurality of elements, such as two parallel conductor lines, as shown in FIG. 6, namely the conductor line 16 and another conductor line 58 formed on the layer 14 and extending parallel to the line 16, which conductor line 58 is also situated in the region bounded by the two groups of superposed conductors, the height of these groups exceeding that of the line 16.

From layer 14 upwards, the superposed conductors are referenced 60, 62 and 64, on one side of the lines 16 and 58 to be isolated, and 66, 68 and 70 on the other side of the lines 16 and 58.

As the Figure shows, the superposed conductors are electrically interconnected by vias formed across an electrically insulating material such as silicon dioxide.

Figure 7:
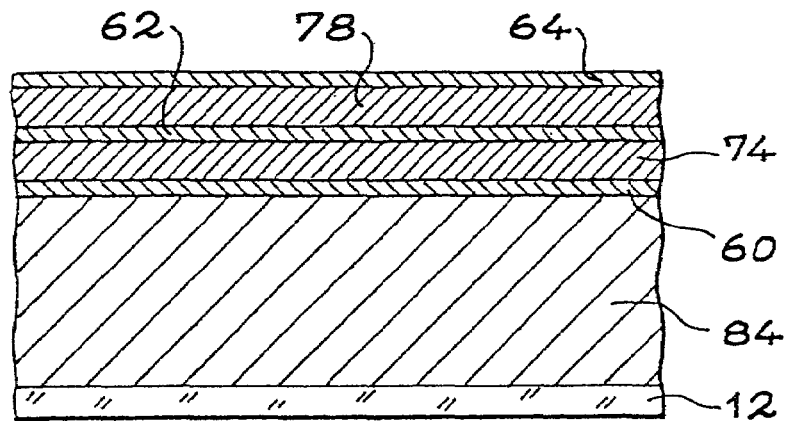
FIG. 7 is a cross-sectional view taken on the line VII—VII in FIG. 6, FIG. 8 diagrammatically shows a variant of FIG. 7, FIG. 9 diagrammatically shows a part of another particular embodiment of the device in accordance with the invention.

The conductors 60 and 66 are formed first on the silicon dioxide layer 14. Next, a silicon dioxide layer 72 which covers the conductors 60 and 66 as well as the conductor lines 16 and 58 is formed on said silicon dioxide layer, after which two continuous vias 74 and 76 (see FIG. 7) extending on, respectively, the conductors 60 and 66 are formed across said layer 72.

Subsequently, at the surface of said layer 72, the conductors 62 and 68 are formed which are in contact with, respectively, the conductors 60 and 66 by means of the vias 74 and 76. Next, a silicon dioxide layer 77 covering the conductors 62 and 68 is formed on the layer 72, after which two vias 78 and 79 are formed across said layer 77, said vias being in contact with, respectively, said conductors 62 and 68.

Subsequently, the conductors 64 and 70 are formed on the surface of this layer 77, said conductors being in contact with, respectively, the conductors 62 and 68 through the vias 78 and 79.

Alternatively, instead of utilizing continuous vias to interconnect two adjacent superposed conductors (see FIG. 7), use can be made of several discrete vias, such as the arrangement of vias 74a or 78a (see FIG. 8), which interconnect these two conductors through the isolating layer separating these conductors.

Figure 8:
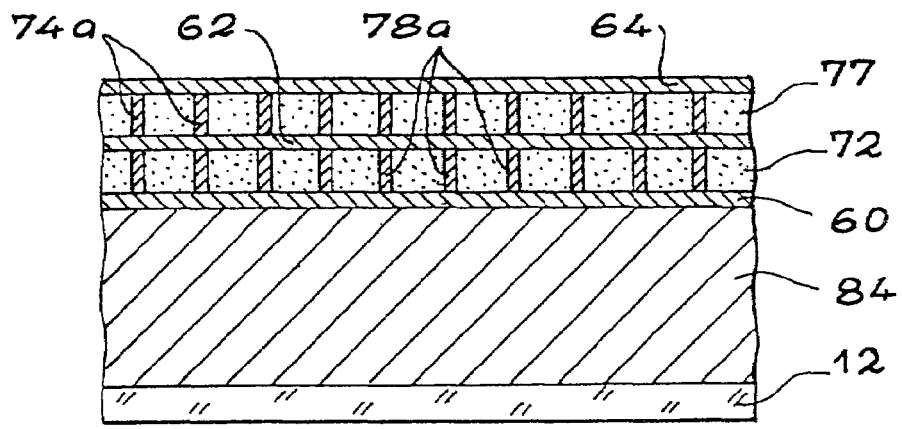

The vias 74a and 78a shown in FIG. 8 are substantially wire-shaped and the spacing between these wires is chosen in dependence upon the frequency of the electric signals to be isolated.

In another example of the invention, two trenches 80 and 82 (see FIG. 6) may be provided, which are of the same type as the trenches 30 and 32 shown in FIG. 4, said trenches being arranged below the conductors 60 and 66, respectively. These trenches are filled with isolating layers 84 and 86, which may be made of an electrically insulating material or, conversely, of an electrically conducting material since this material is in contact with the conductors 60 and 66.

Figure 5:
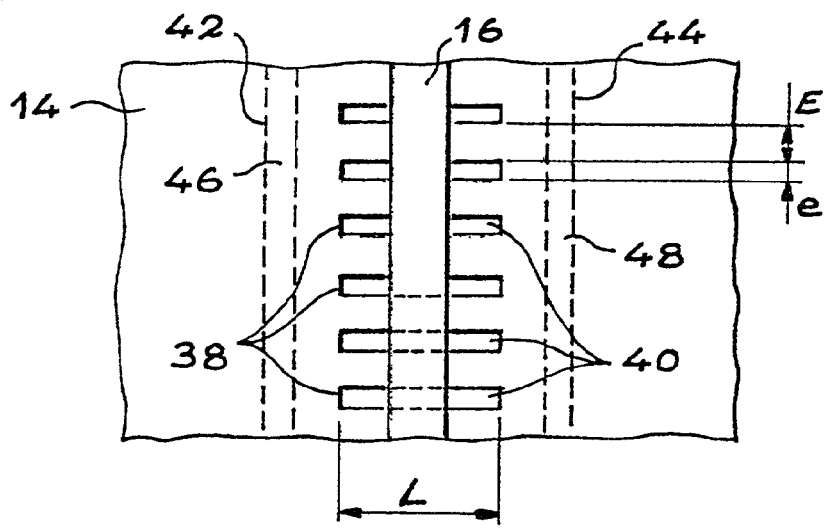
FIG. 5 is a diagrammatic plan view of a part of another particular embodiment of the device in accordance with the invention.

In addition to the trenches 80 and 82, or in the absence thereof, it is also possible to provide transverse trenches 88 of the same type as the trenches 38 shown in FIG. 5. These trenches 88 extend below the elements to be isolated, as shown in FIG. 6, and they are filled with isolating layers 90 which are made of an electrically insulating material.

It is also possible to provide an electrically conducting layer 91 on the insulating layer 77, which electrically conducting layer extends above the elements to be isolated (lines 16 and 58) and interconnects the two uppermost conductors 64 and 70 which are arranged, respectively, on either side of these elements such as to form an integrated electromagnetic screen.

Figure 9:
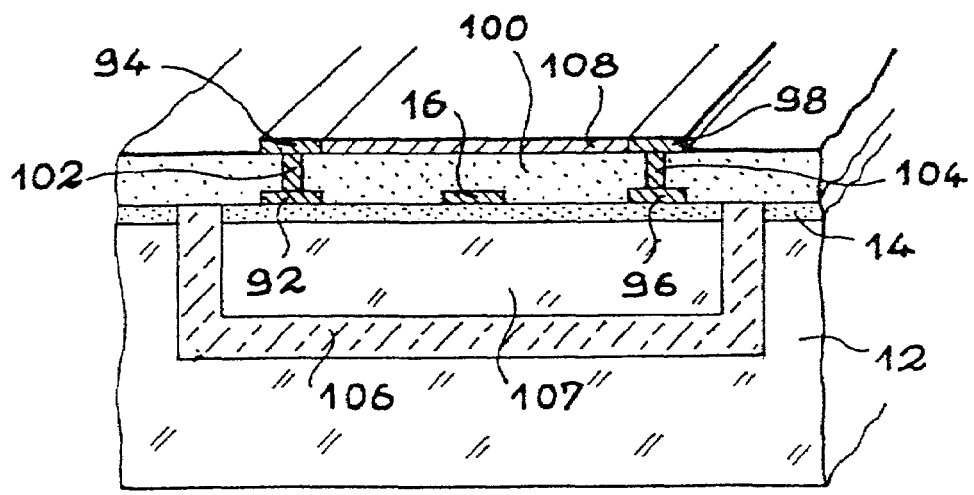

Another example of the invention is diagrammatically shown in FIG. 9, wherein the conductor line 16 to be isolated is shown. On either side of this line 16 and along said line, there are provided two pairs of electric conductors 92–94 and 96–98. The conductors 92 and 96 are formed on the silicon dioxide layer 14. Another silicon dioxide layer 100 is formed on the layer 14 and covers the conductors 92 and 96 as well as the conductor line 16.

The conductors 94 and 98 are formed on this layer 100, and vias 102 and 104, which may be continuous (as in the example shown in FIG. 7) or discontinuous (as in the example shown in FIG. 8) interconnect, respectively, the conductors 92 and 94 and the conductors 96 and 98 via the layer 100.

In addition, an isolating layer 106 extends below the conductors 92 and 96 and below the conductor line 16 and comes again to the surface of the layer 14 in the direction of the conductor 92 and the conductor 96 in order to thus isolate a region 107 from the substrate wherein the line 16 is formed.

An isolating material may be used for the layer 106, in which case the method is carried out in the following manner: the silicon substrate initially comprises a buried thin oxide film, whereafter trenches filled with oxide are added so as to be in contact with said oxide layer, thereby forming an isolation well.

To obtain optimum isolation against the effects of high-frequency signals, the additional isolating layer 106 may be formed by deep diffusion into the substrate 12 and the isolating layer 14: if the substrate is of the P-type (or N-type) use is made of a N-type (respectively P-type) buried layer 106.

It is also possible to provide a conducting layer 108, which is formed at the surface of the silicon dioxide layer 100, above the conductor 16, which conducting layer interconnects the rectilinear conductors 94 and 98.

Figure 10:
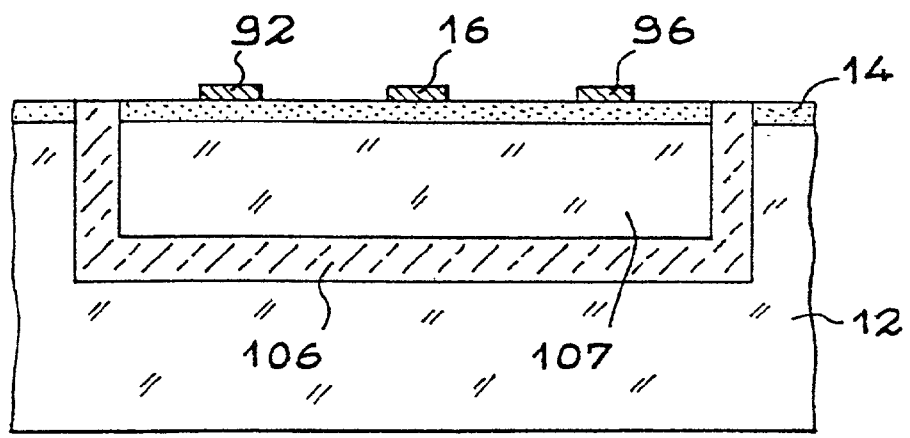
FIG. 10 is a diagrammatic, cross-sectional view of a particular embodiment of the device in accordance with the invention.

Another example of the invention is diagrammatically shown in FIG. 10. The isolation device shown in said FIG. 10 is simpler than that shown in FIG. 9. In the case of FIG. 10, use is simply made of the conductors 92 and 96 as well as of the isolating layer 106 which isolates the portion 107 from the substrate 12.

Figure 11:
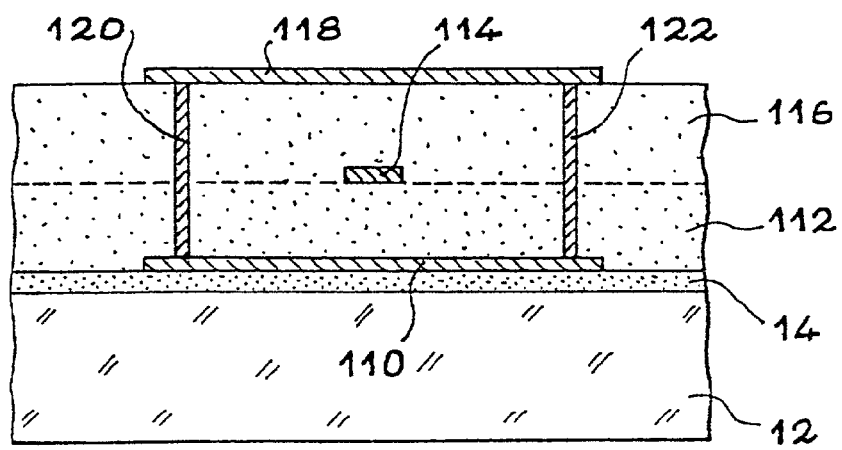
FIG. 11 is a diagrammatic, cross-sectional view of a device in accordance with the invention, forming also a "tri-plate" structure.
Figure 12:
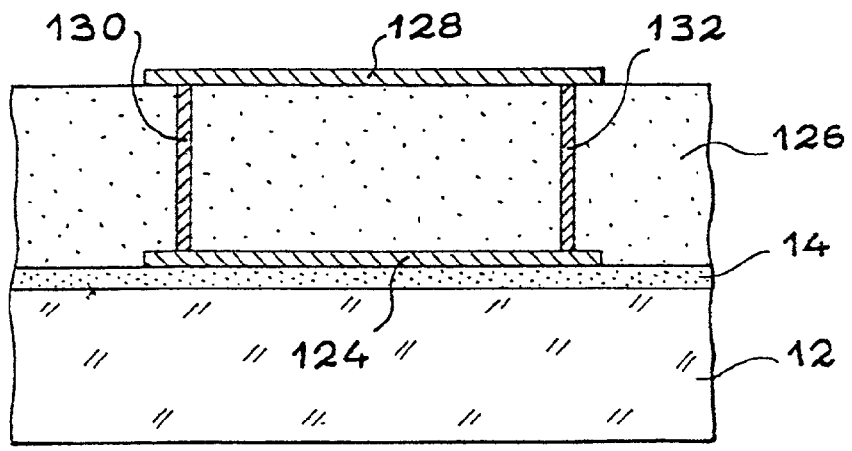
FIG. 12 is a diagrammatic, cross-sectional view of another device in accordance with the invention, forming also a waveguide.

By judiciously choosing the dimensions of a device in accordance with the invention, it is possible to obtain an integrated propagation medium that is compatible with the hyperfrequencies (FIG. 11), and even an integrated waveguide for the millimetric frequencies (FIG. 12).

FIG. 11 shows the substrate 12, which is also covered with the silicon dioxide layer 14. A conducting layer 110, for example of polysilicon having a low resistivity, is formed on this layer 14.

An isolating layer 112, for example of silicon dioxide, covers this conducting layer 110, and a rectilinear conductor 114 is formed on this isolating layer 112. This conductor 114 extends above and along the conducting layer 110.

This isolating layer 112 and this conductor 114 are covered with another silicon dioxide isolating layer 116. Next, another conducting layer 118, which is substantially identical to the layer 110 and extends above said layer 110, is formed on the layer obtained by uniting these two isolating layers 112 and 116.

As a result, the conductor 114 is situated between these two conducting layers 110 and 118 and is isolated from these layers, thereby forming a "tri-plate" structure.

Depending on the frequency of the signals to be transmitted by means of this structure, it is possible to provide, or to refrain from providing, vias 120 and 122 (preferably two continuous vias) which are arranged, respectively, on either side of the conductor 114 and interconnect the conducting layers 110 and 118 via the isolating layers 112 and 116. The conducting layers 110 and 118, as well as the vias 120 and 122, are advantageously connected to the same voltage reference terminal.

The signals transported by this "tri-plate" structure are thus isolated, in accordance with the invention, from other electric signals transported in other elements on the substrate 12 outside this "tri-plate" structure.

Yet another example of the invention is diagrammatically shown in FIG. 12, wherein the semiconductor substrate 12 is also covered by the silicon dioxide layer 14. A conducting layer 124 is formed on this silicon dioxide layer 14.

An isolating layer 126, for example of silicon dioxide, covers this conducting layer 124. Another conducting layer 128 is formed at the surface of this isolating layer 126, above the conducting layer 124, and these conducting layers 124 and 128 are interconnected, across the isolating layer 126, by means of the vias 130 and 132 (preferably two continuous vias). The conducting layers 124 and 128 as well as the vias 130 and 132 are advantageously connected to the same reference voltage terminal.

In this manner a waveguide-type propagation medium is formed.

The electric signals, which are transported by this waveguide (in the isolating region 134 bounded by the conducting layers 124 and 128 and the vias 130 and 132), and the frequencies of which are in the millimetric range, are thus isolated from electric signals that propagate in other elements formed on the substrate 12 (outside the waveguide).

The conductors, the conductor lines or tracks and the conducting layers mentioned hereinabove are made, for example, of a metal such as aluminum.

The vias are made, for example, of a metal such as tungsten.

In addition, only the example shown in FIG. 2 employs a bias source. However, use can be advantageously made of such a source when an isolating layer obtained by N or P-type diffusion is used.

In the examples shown in FIGS. 2 through 10, use is made of an isolating layer provided on the surface of the semiconducting substrate. However, it would be possible to omit this layer in the case of the examples described with respect to FIGS. 11 and 12.

Moreover, in the examples described with respect to FIGS. 2 through 10, one or several conductor tracks are isolated. However, these examples of the invention also enable to isolate for example parts of the circuit which are likely to be affected by external electromagnetic interference.

What is claimed is:

1. A device for isolating at least one electric or electronic element integrated onto a semiconductor substrate, comprising:
   at least one electrically insulating or semiconducting isolating layer which extends in the substrate and is laterally spaced from said element;
   an assembly, which is disposed over the substrate, said assembly including, on either side of the element, at least two superposed electric conductors, which extend along the element, wherein the assembly has a height that exceeds a height of the element; and
   at least one transverse trench which extends at least partly directly beneath said element and is filled with an electrically insulating material.

2. A device as claimed in claim 1, which comprises two isolating layers, which fill two trenches extending in the substrate, perpendicularly to the surface of the substrate and along the element, on either side of this element.

3. A device as claimed in claim 2, wherein each trench extends below the two superposed electric conductors.

4. A device as claimed in claim 1, wherein the superposed electric conductors are electrically interconnected by at least one via formed through an electrically insulating material.

5. A device as claimed in claim 1, which additionally comprises an electrically conducting layer which extends above the element and connects the two uppermost electric conductors to each other, said conductors being arranged on either side of the element.

* * * * *